United States Patent [19]

Kadosawa et al.

[11] Patent Number: 5,050,196
[45] Date of Patent: Sep. 17, 1991

[54] RADIATION GAUGE

[75] Inventors: Tsuneaki Kadosawa, Ninomiyamachi; Nobushige Korenaga, Atsugi, both of Japan

[73] Assignee: Canon Kabushiki Kaisha, Tokyo, Japan

[21] Appl. No.: 532,114

[22] Filed: Jun. 1, 1990

Related U.S. Application Data

[63] Continuation of Ser. No. 159,351, Feb. 23, 1988, abandoned.

[30] Foreign Application Priority Data

Feb. 26, 1987 [JP] Japan .................................. 62-41514

[51] Int. Cl.$^5$ ............................................. H05G 1/26
[52] U.S. Cl. ........................................ 378/34; 378/97; 378/108; 378/207; 750/252.1
[58] Field of Search ...................... 378/34, 35, 96, 97, 378/108, 207, 56; 250/252.1 R, 252.1 A, 442.1, 492.2 R, 492.21

[56] References Cited

U.S. PATENT DOCUMENTS

| 3,275,831 | 9/1966 | Martin | 378/160 |
| 3,600,584 | 8/1971 | Schneble | 378/97 |
| 4,021,675 | 5/1977 | Shifrin | 250/492.21 |
| 4,061,829 | 12/1977 | Taylor | 378/35 |
| 4,301,237 | 11/1981 | Burns | 378/35 |
| 4,369,370 | 1/1983 | Spohr | 378/160 |
| 4,562,586 | 12/1985 | Honda et al. | 378/108 |

FOREIGN PATENT DOCUMENTS

| 3014846 | 10/1981 | Fed. Rep. of Germany | 378/160 |
| 0033832 | 4/1981 | Japan | 250/442.1 |
| 0077400 | 5/1985 | Japan | 378/96 |

Primary Examiner—Carolyn E. Fields
Assistant Examiner—David P. Porta
Attorney, Agent, or Firm—Fitzpatrick, Cella, Harper & Scinto

[57] ABSTRACT

An X-ray aligner provided with a radiation gauge for detecting an intensity of the X-ray radiation. The sensitivity of the radiation gauge is influenced by the passed exposure, the passed non-exposure period and/or the time elapsed. The sensitivity change is compensated by the present invention. Thus, the correct exposure can be provided.

16 Claims, 2 Drawing Sheets

RADIATION GAUGE

This application is a continuation of application Ser. No. 07/159,351 filed Feb. 23, 1988, now abandoned.

FIELD OF THE INVENTION AND RELATED ART

The present invention relates to a radiation gauge for measuring a quantity of exposure, particularly suitable to an exposure apparatus wherein an exposure is effected by radiation such as X-rays, and the quantity of exposure is controlled while the exposure quantity is monitored.

An X-ray exposure apparatus is used or is considered to be used with an X-ray source such as an X-ray tube or synchrotron radiation apparatus or the like. In this case, it is required that the radiation (X-rays) quantity projected is monitored, in response to which an exposure period for the exposure of a substrate such as a wafer coated with an X-ray sensitive material (resist) to the radiation is determined to provide an optimum exposure. This is because a line width of the resist pattern changes in accordance with the exposure quantity due to diffraction or the like in the case of a synchrotron radiation source or the like which is considered to be a practical X-ray source, the quantity or amount of radiation of the X-rays is dependent on the energy of the electrodes and current. Practically, however, an actual amount of exposure of a mask or the like changes depending on contamination of a mirror or mirrors and/or a window or windows. Therefore, it is required that the amount of X-rays applied to the mask or the like is accurately measured in an exposure station or the like. To meet this, a sensor such as a semiconductor sensor or a photodiode is considered to be used, since they have a high sensitivity and are small in size which is suitable in the exposure station having little space. However, the sensitivity of those sensors changes with time and with the degree of past exposure to radiation such as X-rays, due to the property of the materials of the sensors. To detect the correct radiation amount, therefore, the sensor has to be frequently exchanged with a new one.

SUMMARY OF THE INVENTION

Accordingly, it is a principal object of the present invention to provide a radiation amount detecting device for measuring a correct amount of incident radiation by compensating for the change in the sensitivity which results from the exposure, and for the time of use of the radiation amount detecting device, particularly, a semiconductor sensor or a photodiode sensor having a sensitivity influenced by the past radiation exposure and the time of use.

According to an embodiment of the present invention, the radiation exposure amount received by the sensor is accumulated as an amount of exposure from the start of the use of the sensor. On the other hand, the sensitivity change resulting from the amount of past exposure is determined on the basis of an empirical rule. The output of the sensor is calibrated in accordance with the accumulation on the basis of the determination.

These and other objects, features and advantages of the present invention will become more apparent upon a consideration of the following description of the preferred embodiments of the present invention taken in conjunction with the accompanying drawings. dr

DESCRIPTION OF THE PREFERRED EMBODIMENTS

Figure 1:
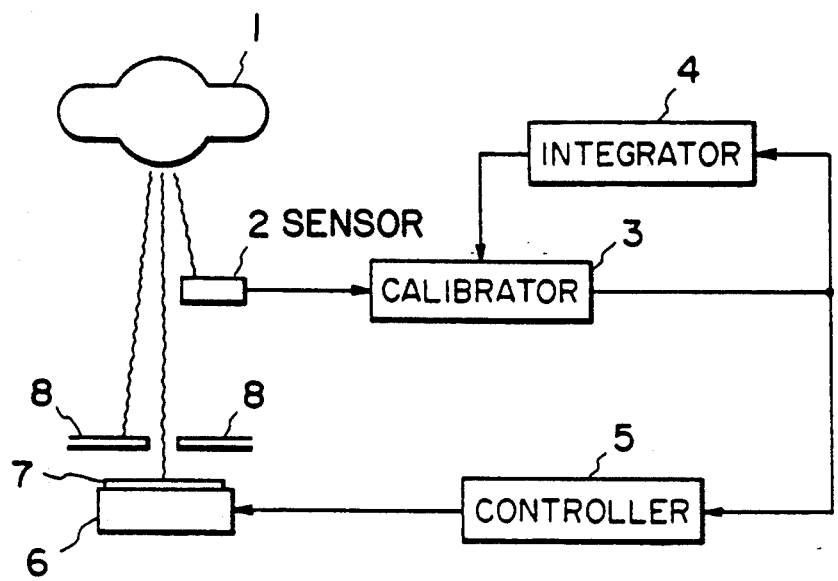
FIG. 1 is a somewhat schematic view of a radiation detecting device according to an embodiment of the present invention.

Referring to FIG. 1, there is shown a slit-scan type exposure apparatus incorporating a radiation detecting device according to a first embodiment of the present invention, wherein a reference numeral 1 designates an X-ray source such as an X-ray tube or a synchrotron radiation source. A quantity of X-ray radiation projected is detected by a sensor 2. The output of the sensor 2 is calibrated by a calibrator 3. The output signal representative of the calibrated data from the calibrator is accumulated or integrated by an integrator 4 from the start of the detection by the sensor. A control means 5 including a driving mechanism drives a stage 6 which carries a substrate coated with a photosensitive material (resist). The substrate is exposed to the X-ray radiation through a slit 8.

The sensor 2 in this embodiment is of a semiconductor or photodiode type. As described hereinbefore, the sensitivity of the sensor 2 changes in accordance with the history of the use of the sensor, more particularly, the accumulated or integrated amount of the exposure in the past. Therefore, the output of the sensor 2 does not always represent the correct exposure amount. However, it has been found that the sensitivity change with the accumulated exposure is not random, but is the same for all of the same type sensors. On the basis of this fact, the calibrator 3 is effective to provide a correct amount of exposure on the basis of both the sensor output and the integrated amount of exposure. In other words, the output of the sensor 2 is corrected on the basis of the accumulated exposure amount. The degree of correction is predetermined using an empirical rule, which has been obtained as a result of a comparison between an output of the sensor and a reference sensor, for example, a proportional counter. The accumulated amount of exposure is given to the calibrator 3 from the integrator 4.

Figure 2:
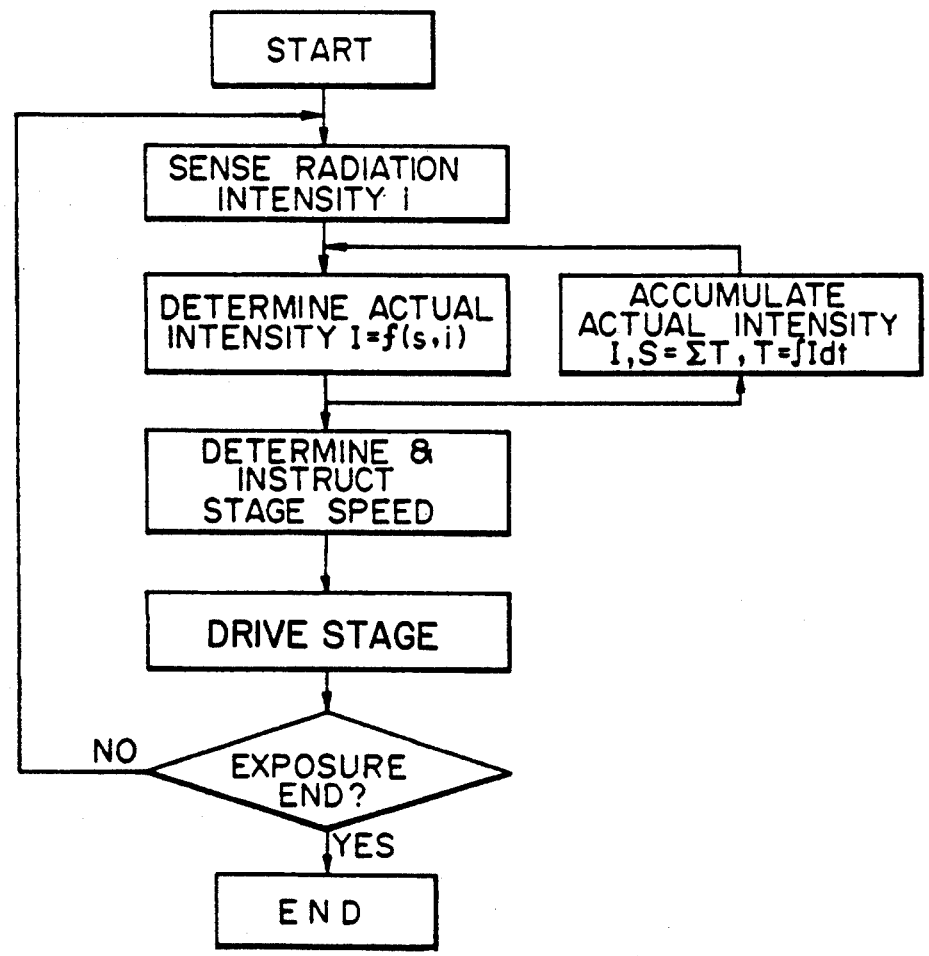
FIG. 2 is a flow chart illustrating a control in an operation of the device of FIG. 1.

Referring to FIGS. 1 and 2, the operation will be described. The X-rays generated by the source 1 are directed to the sensor 2, the substrate 7 and the slit 8. The sensor 2 produces an output signal i which changes with an amount of the exposure of the sensor to the X-rays per unit time, i.e., intensity of the X-rays. The output i of the sensor 2 is transmitted to the calibrator 3, which then produces a correct intensity of exposure I on the basis of the output signal i of the sensor 2 and the output of the integrator 4 indicative of the accumulated amount of exposure of the sensor 2. The output I indicative of the correct intensity of the current exposure is transmitted both to the integrator 4 and the control means 5. The integrator 4, receiving the output I of the calibrator 3, accumulates the calibrated output I. The control means 5 determines a drive speed to be instructed to the driving mechanism contained in the control means, on the basis of the calibrated output signal I and an optimum amount of exposure for the resist used. Here, the amount of exposure is expressed by the intensity of the X-ray irradiation multiplied by an exposure period. The signal representative of the determination of the speed is transmitted to the driving mechanism, which in turn drives the stage 6 in response to the signal. By this, the amount of exposure of the substrate 7 through the slit 8 to the X-rays is maintained constant. In this embodiment, the control of the amount of exposure is effected by controlling the speed of the stage 6.

Figure 3:
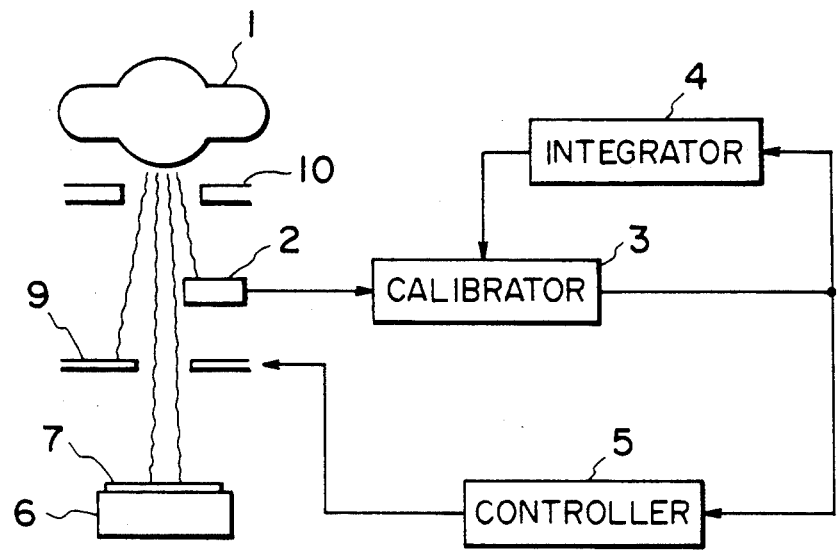
FIG. 3 illustrates a modification of the first embodiment.

Referring to FIG. 3, in the case of a proximity type exposure apparatus, the driving mechanism may control the open period of the shutter 9.

An example of the empirical rule used will now be described. When an Si photodiode, for example, is exposed to X-ray radiation, a light current $I_L$ proportional to the intensity of the X-rays is produced. However, an output of the photodiode Isc is changed from the current $I_L$ due to a dark current or the like.

The relationship between output of the photodiode the Isc and current $I_L$ is:

$$Isc = IL - Is[exp(e \times Rs \times Isc/kT) - 1]$$

$I_L$: current generated by the incident radiation;
Is: reverse saturated current of photodiode;
Isc: output current;
Rs: series resistance in the photodiode;
k: Boltzmann's constant;
T: absolute temperature of sensor;
e: charge of electron.

In the above equation, the current Is changes depending on the past accumulated amount of exposure of the sensor. The current Is is empirically determined with respect to the accumulated exposure. The following is an example:

| Accumulated Exposure | Current Is |
|---|---|
| 0J | $1.8 \times 10^{-8}$A |
| 40J | $7.6 \times 10^{-10}$A |
| 50J | $1.04 \times 10^{-10}$A |

In the case of SOR used as the radiation source, one shot corresponds to 100 mJ, and therefore, 50 J corresponds to 500 shots.

On the empirical relation, the calibration equation is preset in the calibrator 3. The calibration may not be performed by the calibrating equation, but may be performed by a ROM storing the outputs corresponding to the inputs.

A second embodiment will be described, wherein a sensor recovers its sensitivity during a non-exposure period. This recovering property occurs in a semiconductor sensor or photodiode used under a relatively high temperature, for example.

Figure 4:
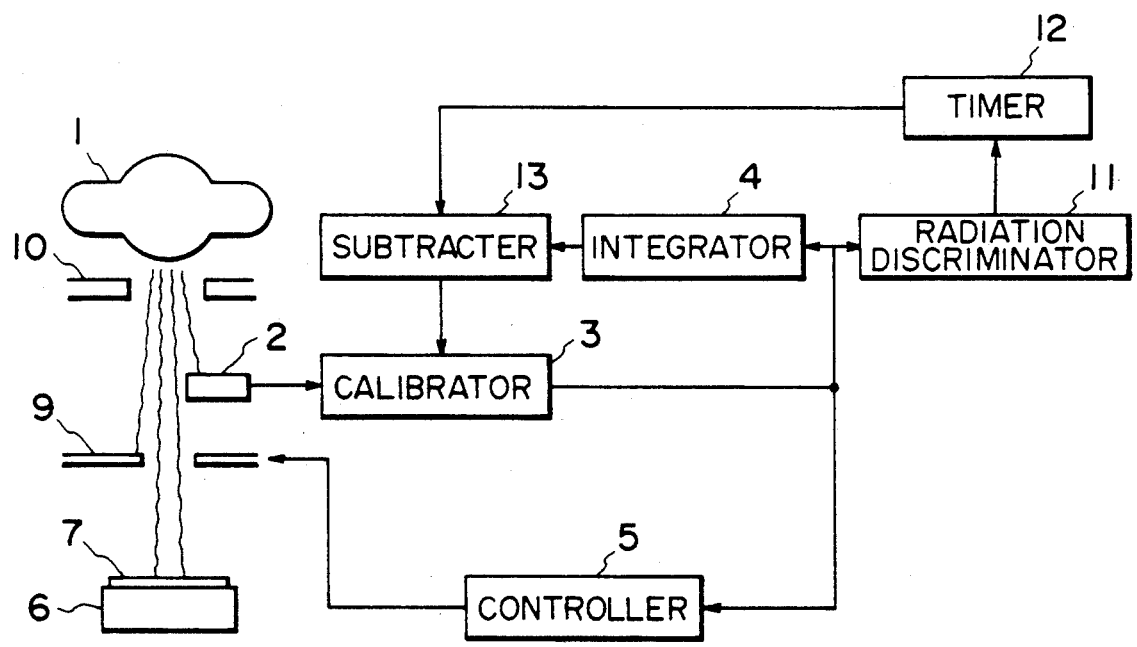
FIG. 4 illustrates a radiation detecting device according to a second embodiment of the present invention.

Referring to FIG. 4, there is shown a second embodiment, wherein like reference numerals are used for the elements having corresponding functions as in the FIGS. 1 and 3 embodiments, and the detailed explanation thereof is omitted for the sake of simplicity. The apparatus is provided with a shutter 9 for controlling the amount of exposure and a shutter 10 for blocking the X-rays. The shutter 10 is effective to block the X-rays to prevent them from leaking into the exposure station, when, for example, the substrate or the mask is exchanged. By this, upon the exchanging operation, the X-rays are prevented from leaking outside, and the substrate coated with the resist is prevented from being exposed to the X-rays. The apparatus further includes an exposure amount discriminator 11 for discriminating whether the exposure operation is effected or not, which is connected to a timer 12 responsive to the output signal of the discriminator 11 to count the non-exposure period. An output of the timer 12 is transmitted to a subtracter 13 for subtracting the output of the integrator 4.

According to this embodiment, a correct amount of exposure can be measured even if the sensor is of such a type that a sensitivity change of the sensor recovers during the non-exposure period.

In operation, the discriminator 11 discriminates whether the exposure operation is being performed or not. If it is discriminated as being during the exposure operation, the same control operations are carried out as in the first embodiment. On the contrary, if non-exposure is discriminated, the timer 12 operates to measure the non-exposure period of time. The subtracter 13 calculates an exposure amount for correcting the integrated amount in accordance with the recovery property of the sensor which has been empirically determined. The subtracter 13 subtracts the exposure amount from an output of the integrator 4 prior to the non-exposure period. By doing so, when the exposure is resumed, the sensor output is correctly calibrated to provide a correct amount of exposure. It is possible that the amount of correction due to the non-exposure period changes with the integrated amount of exposure at the start of the non-exposure period. In order to provide correct data even in this case, the amount of the correction is preferably further corrected by an additional correction which has been empirically determined with respect to the integrated amount of exposure at the time of the non-exposure period.

Similar to the case of the first embodiment, the correction by the subtracter 13 may be performed by a correction equation predetermined empirically or may be made using a ROM memorizing outputs corresponding to inputs.

When it is desirable to monitor to the sensitivity change with elapse of time, an additional timer for counting the time from the start of use of the sensor may be incorporated into the first and second embodiments to effect the correction on the basis of the elapse of time in addition to the correction by the exposure and/or the length of the non-exposure period. The correction on the basis of the time elapsed can be empirically predetermined. The amount of exposure corresponding to the correction is subtracted from the output of the integrator 4.

In the foregoing, the description has been made with respect to a radiation amount detecting device usable with an X-ray aligner, but the present invention also is applicable to an aligner using as an exposure light g-rays or i-rays, if the sensitivity of the sensor changes with an integrated exposure amount, with a non-exposure period and/or with a elapse of time.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a substrate to radiation rom a radiation source, said apparatus comprising:

detecting means, sensitive to the radiation from the radiation source, for detecting the radiation to produce a detection output;

correcting means for correcting the detection output to produce a corrected output signal; and an integrator for integrating the corrected output signal from said correcting means to produce an integration output signal; and control means for controlling the exposure of the substrate to the radiation in accordance with the corrected output signal from said correcting means;

wherein said correcting means adjusts a degree of correction of the detection output in accordance with the integration output signal from said integrator.

2. An apparatus according to claim 1, wherein said control means controls movement speed of a stage carrying the substrate to control the amount of exposure of the substrate.

3. An apparatus according to claim 1, wherein said control means controls an open period of a shutter.

4. An exposure apparatus for exposing a substrate to radiation from a radiation source, said apparatus comprising:

detecting means, sensitive to the radiation from the radiation source, for receiving a quantity of the radiation and for detecting the radiation to produce a detection output, said detecting means having a sensitivity property which changes in accordance with the quantity of received radiation;

correcting means for correcting the detection output in accordance with the change in the sensitivity property of said detecting means to produce a corrected output signal, said correcting means including data for adjusting a degree of correction of the detection output by said correcting means in accordance with a value of an integration of the quantity of the radiation received by said detecting means; and control means for controlling the exposure of the substrate to the radiation from the radiation source.

5. An apparatus according to claim 4, wherein said control means controls movement speed of a stage carrying the substrate to control the amount of exposure of the substrate.

6. An apparatus according to claim 4, wherein said control means an open period of a shutter.

7. A radiation detecting apparatus comprising:

radiation detecting means, sensitive to radiation, for producing a detection output;

correcting means for receiving the detection output directly from said detecting means and for correcting the detection output in accordance with a sensitivity characteristic change of said detecting means and for producing a corrected output signal; and integrating means for integrating the corrected output signal and for producing an integrated signal;

wherein said correcting means operates in accordance with the integrated signal produced by said integrating means.

8. An exposure apparatus for exposing a substrate with radiation, said exposure apparatus comprising:

radiation detecting means sensitive to the radiation for producing a detection output;

correcting means for receiving the detection output signal directly from said detecting means and for correcting the detection output in accordance with a sensitivity characteristic change of said detecting means and for producing a corrected output signal;

integrating means for integrating the corrected output signal and for producing an integrated signal;

control means for controlling the amount of exposure of the substrate to the radiation in accordance with the corrected signal produced by said correcting means;

wherein said correcting means operates in accordance with the integrated signal produced by said integrating means.

9. An apparatus according to claim 8, wherein said control means controls movement speed of a stage carrying the substrate to control the amount of exposure of the substrate.

10. An apparatus according to claim 8, wherein said control means controls an open period of a shutter.

11. An exposure apparatus for exposing a substrate with radiation, said exposure apparatus comprising:

a radiation detector for producing a detector output, said detector being sensitive to the radiation and having a sensitivity changing with exposure to the radiation;

a calibrator for receiving the detector output directly from said detector and for correcting the detector output in accordance with a sensitivity characteristic change of said detector and for producing a calibrator output;

an integrator for integrating the calibrator output and for producing an integrator output;

determining means for determining data for controlling the exposure of the substrate in accordance with the detector output and the integrator output; and control means for controlling exposure of the substrate in accordance with the data determined by said determining means.

12. An apparatus according to claim 11, wherein said control means movement speed of a stage carrying the substrate to control the amount of exposure of the substrate.

13. An apparatus according to claim 11, wherein said control means controls an open period of a shutter.

14. A radiation detector for detecting radiation from a radiation source, said detector comprising;

detecting means, sensitive to the radiation from the radiation source, for detecting the radiation to produce a detection output;

correcting means for correcting the detection output to produce a corrected output signal; and an integrator for integrating the corrected output signal from said correcting means to produce an integration output signal;

wherein said correcting means adjusts a degree of correction of the detection output in accordance with the integration output signal from said integrator.

15. A radiation detector, comprising:

means for detecting radiation intensity;

correcting means for correcting the intensity of the radiation detected by said detecting means;

an integrator for integrating signals corresponding to outputs of said detecting means when said detecting means receives radiation;

a discriminator for discriminating whether said detecting means is being exposed to the radiation or not; and a timer responsive to said discriminating means to count a non-exposure period;

wherein said correcting means corrects the detection of said detecting means on the basis of an output of said timer and an output of said integrator.

16. An exposure method for exposing a substrate to radiation from a radiation source, said method comprising:

directing the radiation to the detection means, sensitive to the radiation from the radiation source, for detecting the radiation to produce a detection output;

correcting the detection output to produce a corrected output signal; and integrating the corrected output signal from said correcting step to produce an integration signal;

adjusting a degree of correction of the detection output in said correcting step in accordance with the integration signal from said integrating step; and controlling exposure of the substrate to the radiation in accordance with the corrected output signal.

* * * * *

UNITED STATES PATENT AND TRADEMARK OFFICE
CERTIFICATE OF CORRECTION

PATENT NO. : 5,050,196

DATED : September 17, 1991

INVENTOR(S) : Tsuneaki Kadosawa, et al.

It is certified that error appears in the above-identified patent and that said Letters Patent is hereby corrected as shown below:

COLUMN 1

Line 68, "dr" should be deleted.

COLUMN 3

Line 21, "between" should read --between the--;
    Line 22, "the" should be deleted; and
    Line 24, "Isc=IL-Is[exp(e × Rs × Isc/kT)-1)" should read --Isc = $I_L$- Is{exp(e × Rs × Isc/kT)-1}--.

COLUMN 5

Line 2, "rom" should read --from--;
    Line 8, "signal; and" should read --signal;--; and
    Line 51, "means" should read --means controls--.

UNITED STATES PATENT AND TRADEMARK OFFICE
CERTIFICATE OF CORRECTION

PATENT NO. : 5,050,196

DATED : September 17, 1991

INVENTOR(S) : Tsuneaki Kadosawa, et al.

It is certified that error appears in the above-identified patent and that said Letters Patent is hereby corrected as shown below:

COLUMN 6

Line 7, "signal;" should read --signal; and--;
    Line 43, "means" should read --means controls--; and
    Line 49, "comprising;" should read --comprising:--.

Signed and Sealed this

Twenty-fifth Day of May, 1993

Attest:

MICHAEL K. KIRK

Attesting Officer      Acting Commissioner of Patents and Trademarks